United States Patent
Ibe et al.

(10) Patent No.: US 8,892,967 B2
(45) Date of Patent: Nov. 18, 2014

(54) MEASUREMENT DEVICE AND MEASUREMENT METHOD

(75) Inventors: Hidefumi Ibe, Kawasaki (JP); Tadanobu Toba, Yokohama (JP); Ken-ichi Shimbo, Yokohama (JP); Hitoshi Taniguchi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 316 days.

(21) Appl. No.: 13/384,012

(22) PCT Filed: Jul. 8, 2010

(86) PCT No.: PCT/JP2010/061580
§ 371 (c)(1),
(2), (4) Date: Mar. 6, 2012

(87) PCT Pub. No.: WO2011/007708
PCT Pub. Date: Jan. 20, 2011

(65) Prior Publication Data
US 2012/0159269 A1    Jun. 21, 2012

(30) Foreign Application Priority Data
Jul. 15, 2009   (JP) .................................. 2009-166489

(51) Int. Cl.
| | |
|---|---|
| G06F 11/00 | (2006.01) |
| G11C 29/04 | (2006.01) |
| G01R 31/3181 | (2006.01) |
| G11C 11/412 | (2006.01) |
| H03K 19/003 | (2006.01) |
| G01R 31/00 | (2006.01) |
| G01R 31/307 | (2006.01) |

(52) U.S. Cl.
CPC .......... *G01R 31/31816* (2013.01); *G11C 29/04* (2013.01); *G11C 11/4125* (2013.01); *H03K 19/0033* (2013.01); *G01R 31/002* (2013.01); *G01R 31/307* (2013.01)

USPC ........................... 714/704; 714/731; 714/823

(58) Field of Classification Search
CPC ................................... H04L 1/20; H04L 1/24
USPC .................... 714/704, 731, 823, 15
See application file for complete search history.

(56) References Cited

U.S. PATENT DOCUMENTS 5,572,261 A * 11/1996 Cooper ......................... 348/512
6,542,838 B1 * 4/2003 Haddad et al. .................. 702/88

(Continued)

FOREIGN PATENT DOCUMENTS

| JP | 2001-215255 A | 8/2001 |
| JP | 2004-125633 A | 4/2004 |

(Continued)

OTHER PUBLICATIONS

Xiaowei Zhu et al., "A Quantitative Assessment of Charge Collection Efficiency of N+ and P+ Diffusion Areas in Terrestrial Neutron Environment", IEEE Transactions on Nuclear Science, vol. 54, No. 6, Dec. 2007, pp. 2156-2161.

(Continued)

*Primary Examiner* — Fritz Alphonse
(74) *Attorney, Agent, or Firm* — Crowell & Moring LLP

(57) ABSTRACT

A logic block group 120 having at least one set including a logic block having at least one logic circuit and a sequential circuit that inputs the output of the logic block is arranged in an irradiation region 110 of a high-energy particle irradiation device, and subjected to irradiation with high-energy particles. A control section 101 calculates the error rate of the logic circuit from the value obtained by subtracting the number of errors of the sequential circuit when the logic block of the logic block group 120 is bypassed, from the number of errors of the sequential circuit and the logic block of the logic block group 120.

13 Claims, 13 Drawing Sheets

(56) References Cited

U.S. PATENT DOCUMENTS

| | | |
|---|---|---|
| 6,934,667 B2 * | 8/2005 | Kodosky et al. .......... 703/2 |
| 2005/0211890 A1 | 9/2005 | Ibe et al. |
| 2007/0011513 A1 | 1/2007 | Biswas et al. |

FOREIGN PATENT DOCUMENTS

| | | |
|---|---|---|
| JP | 2005-276360 A | 10/2005 |
| JP | 2006-134938 A | 5/2006 |

OTHER PUBLICATIONS

Eishi Ibe et al., "Distinctive Asymmetry in Neutron-Induced Multiple Error Patterns of 0.13 μm Process SRAM", Oct. 6-8, 2004, (five (5) pages).

Premkishore Shivakumar et al., "Modeling the Effect of Technology Trends on the Soft Error Rate of Combinational Logic", Appears in the Proceedings of the 2002 International Conference on Dependable Systems and Networks, (2002), (ten (10) pages).

N. Seifert et al., "Assessing the Impact of Scaling on the Efficacy of Spatial Redundancy Based SER Mitigation Schemes", (2007), (six (6) pages).

Jedec, "Measurement and Reporting of Alpha Particle and Terrestrial Cosmic Ray-Induced Soft Errors in Semiconductor Devices", JESD89A, JEDEC Standard, No. 89, 2006, (ninty-three (93) pages).

Norbert Seifert et al., "Radiation-Induced Clock Jitter and Race", 2005 IEEE International Reliability Physics Symposium Proceedings, (2005), vol. 43$^{rd}$ Annual, pp. 215-222.

Taiki Uemura et al., "Neutron-Induced Soft Error Simulation Technology for Logic Circuits", Extended Abstracts of the International Conference on Solid State Device and Materials, (2005), pp. 942-943.

J.A. Rivers et al., "Phaser: Phased Methodology for Modeling the System-Level Effects on Soft Errors", IBM J. Res., vol. 52, No. 3 May 2008, pp. 293-306.

J. Benedetto et al., "Heavy Ion Induced Digital Single Event Transients in Deep Submicron Processes", (2004), (nine (9) pages).

David L. Hansen et al., "Clock, Flip-Flop, and Combinatorial Logic Contributions to the SEU Cross Section in 90 nm ASIC Technology", IEEE Transactions on Nuclear Science, vol. 56, No. 6, Dec. 2009, pp. 3542-3550.

V. Ferlet Cavrois et al., "Investigation of the Propagation Induced Pulse Broadening (PIPB) Effect on Single Event Transients in SOI and Bulk Inverter Chains", IEEE Transactions on Nuclear Science, vol. 55, No. 6, Dec. 2008, pp. 2842-2853.

Corresponding International Search Report with English Translation dated Oct. 12, 2010 (five (5) pages).

Form PCT/ISA/237 (three (3) pages).

E. Ibe et al., "Current and Future Trend on Cosmic-Ray-Neutron Induced Single Event Upset at the Ground down to 0.1-Micron-Device", The Svedberg Laboratory Workshop on Applied Physics, Uppsala, May 3, 2001, (three (3) pages).

Eishi Ibe et al., "Spreading Diversity in Multi-Cell Neutron-Induced Upsets with Device Scaling", IEEE Custom lntergrated Circuits Conference, Sep. 10-13, 2006, pp. 437-444.

M. Berg et al., "Risk Reduction for Use of Complex Devices in Space Projects", IEEE Transactions on Nuclear Science, vol. 54, No. 6 Dec. 2007, pp. 2137-2140.

Paul E. Dodd et al., "Neutron-Induced Latchup in SRAMs at Ground Level", (2003), No. 2B.1, (five (5) pages).

A. Bougerol et al., "SDRAM Architecture & Single Event Effects Revealed with Laser", 14$^{th}$ IEEE International On-Line Testing Symposium, 2008, pp. 283-288.

European Search Report dated Jul. 3, 2014 (Four (4) pages).

* cited by examiner

| TYPE OF CIRCUIT | A IN THE TOP (VARIABLE) | B (FIXED) | C | |
|---|---|---|---|---|
| | | | CORRECT | INCORRECT |
| NAND | 1 | 0 | 1/0 ALTERNATELY | 0/1 ALTERNATELY |
| AND | 0 | 1 | 0 | 1 |
| | 1 | 1 | 1 | 0 |
| NOR | 0 | 0 | 1/0 ALTERNATELY | 0/1 ALTERNATELY |
| OR | 0 | 0 | 0 | 1 |
| | 1 | 0 | 1 | 0 |

| TYPE OF CIRCUIT | A IN THE TOP (VARIABLE) | B (FIXED) | C (FIXED) | D | |
|---|---|---|---|---|---|
| | | | | CORRECT | INCORRECT |
| NAND | 0 | 1 | 1 | 1/0 ALTERNATELY | 0/1 ALTERNATELY |
| AND | 0 | 1 | 1 | 0 | 1 |
| | 1 | 1 | 1 | 1 | 0 |
| NOR | 0 | 1 | 1 | 0/1 ALTERNATELY | 1/0 ALTERNATELY |
| OR | 0 | 0 | 0 | 0 | 1 |
| | 1 | 0 | 0 | 1 | 0 |

| A IN THE TOP (VARIABLE) | B IN THE TOP (VARIABLE) | NEXT A INPUT | NEXT B INPUT | FF INPUT TERMINALS (VALUES) | |
|---|---|---|---|---|---|
| | | | | CORRECT | INCORRECT |
| 1 | 1 | Y | D(1) | Y(1) | Y(0) |
| 1 | 0 | X | Y or Z | Y(0) | Y(1) |
| 0 | 1 | X or Y | Z | Y(0) | Y(1) |
| 0 | 0 | X or Z | D(0) | Y(1) | Y(0) |

| A IN THE TOP (VARIABLE) | B IN THE TOP (VARIABLE) | NEXT A INPUT | NEXT B INPUT | FF INPUT TERMINALS (VALUES) | |
|---|---|---|---|---|---|
| | | | | CORRECT | INCORRECT |
| 1 | 1 | C | D(1) | C(1) | C(0) |
| 1 | 0 | S | C | S(1) | S(0) |
| 0 | 1 | C | S | S(1) | S(0) |
| 0 | 0 | S | C | C(0) | C(1) |

US 8,892,967 B2

MEASUREMENT DEVICE AND MEASUREMENT METHOD

TECHNICAL FIELD

The present invention relates to a technique of quantifying error tolerance of a logic device. This application claims priority to Japanese Patent Application No. 2009-166489 filed on Jul. 15, 2009, and in the designated countries where incorporation of documents by reference is approved, the content described in the specification of the aforementioned patent application is incorporated into the present patent application by reference.

BACKGROUND ART

As scaling of semiconductor devices proceeds, the problem of terrestrial neutron soft-error becomes obvious particularly with respect to SRAM (See Non-Patent Document 1). When neutrons of very high energy reach the earth and plunge into nuclei making up a device, nucleons (neutrons and protons) in the nuclei collide with one another repeatedly, and nucleons having particularly-high energies are released out of the nuclei.

As it comes to the point that nucleons cannot have kinetic energies enabling release from nuclei, there follows a process of evaporation of light particles such as protons, neutrons, deuterons and alpha particles from the residual nuclei in an excited state. Finally the residual nuclei have recoil energies too, and thus all of these secondary ions move within the device to distances corresponding to their ranges.

When secondary ions with charges pass through a depletion layer of a storage node in the "high" state in an SRAM, charges are collected in the storage node according to the funneling mechanism similarly to the case of the alpha-ray soft-error. When the collected charges become higher than the critical charge, the "high" state transitions to the "low" state, causing soft-error.

The above has been taken as a typical mechanism of the neutron soft-error. However, as scaling of SRAM proceeds to the level of about 100 nm, many modes that cannot be explained by this mechanism have been reported (See Non-Patent Documents 2-6, for example). Single Event Latch-up (SEL) is a representative example. According to the US standard JESD89-3, SEL is an error that cannot be restored by rewriting and is restored by power cycle (reactivation by turning on the power again). SEL is different from the conventional latch-up that can be, to some extent, taken as a hard error due to firing or meltdown.

There is a memory error mode that can be restored by resetting not by rewriting and is called Single Event Functional Interrupt (SEFI). This is considered as an error in a peripheral circuit. Each of SEL and SEFI is Multi Cell Upset (MCU, a phenomenon that one event causes errors in a plurality of bits). Multi-bit error in one word is highly critical since Error Checking and Correction (ECC) is practically ineffective, and it is called Multi Bit Upset (MBU) in distinction from MCU.

DESCRIPTION OF RELATED ART

Non-Patent Documents

Non-Patent Document 1: Ibe, E., "Current and Future Trend on Cosmic-Ray-Neutron Induced Single Event Upset at the Ground down to 0.1-Micron-Device", The Svedberg Laboratory Workshop on Applied Physics, Uppsala, May 3, No. 1 (2001);

Non-Patent Document 2: E. Ibe, S. Chung, S. Wen, H. Yamaguchi, Y. Yahagi, H. Kameyama, S. Yamamoto, and T. Akioka, 'Spreading Diversity in Multi-cell Neutron-Induced Upsets with Devices Scaling', 2006 CICC, San Jose, Calif., Sep. 10-13, 2006, pp. 437-444 (2006);

Non-Patent Document 3: Berg, M., "Special Paper: Combining Reliable Synchronous Design Methodology with Single Event Inspired Mitigation Techniques", Workshop on Radiation Effects on Components and Systems, Athens, Greece, Sep. 27-29, 2006, No. Special paper (2006);

Non-Patent Document 4: P. E. Dodd, M. R. Shaneyfelt, J. R. Schwank, and G. L. Hash, 'Neutron-induced latchup in SRAMs at ground level', 2003 IRPS, Reno, Nev., No. 2B.1, pp. 51-55 (2003);

Non-Patent Document 5: A. Bougerol (EADS), F. Miller, N. Buard, "SDRAM Architecture & Single Event Effects Revealed with Laser", IOLTS, Rhodes, Greece, July 7-9, No. iolts08-38 (2008); and Non-Patent Document 6: X. Zhu, X. Deng, R. Baumann, S. Krishnan, "A Quantitative Assessment of Charge Collection Efficiency of N+ and P+ Diffusion Areas in Terrestrial Neutron Environment", TNS Vol. 53, No. 6, p. 2156 (2007).

DISCLOSURE OF THE INVENTION

Problem to be Solved by the Invention

As scaling of semiconductor devices develops, the soft-error problem is becoming obvious also with respect to logic devices. Particularly, in the case of a mission-critical system such as a financial system or a safety-critical system such as a car-mounted microcomputer or a traffic control system, it is necessary to incorporate a countermeasure against such problem in the system design phase. At present, however, there is no means to quantify soft-error tolerance of a logic gate by itself (an inverter, a NAND gate, a NOR gate, a flip-flop or the like).

Further, in the case of a logic device, MCU in the case of a memory appears as Multi Node Upset (MNU) and nullifies a redundant system as a countermeasure against soft-error. This is a large problem.

Thus, an object of the present invention is to provide a means of quantifying soft-error tolerance of a logic device.

Means to Solve the Problem

To solve the above problems, in the present invention, a group of logic blocks is irradiated with high-energy particles. The group of logic blocks comprises at least one combination of a logic block (which has at least one logic device) and a sequential circuit that receives, as input, output of the logic block. As a result of irradiating the group of logic blocks with high-energy particles, an error rate of the logic device is calculated by subtracting the number of errors in the sequential circuit when the logic block is bypassed from the number of errors in the logic block and the sequential circuit.

For example, the present invention provides a measurement device comprising: a group of logic blocks, which includes at least one combination of a logic block having at least one logic device, a sequential circuit for receiving, as an input, an output of the logic block, a bypass for bypassing the logic block, and a switch for switching between a path inputting to the logic block and the bypass; and a control part, which: obtains a count of errors in the logic block by turning the switch to the path inputting to the logic block and by irradiating high-energy particles to the group of logic blocks; obtains a count of errors in the logic block by turning the switch to the bypass and by irradiating high-energy particles to the group of logic blocks; and subtracts the latter count of errors from the former count of errors, to calculate an error rate of the logic device on a basis of a count of errors obtained by the subtraction.

Effect of the Invention

Thus, the present invention can provide a means of quantifying soft-error tolerance of a logic device

DESCRIPTION OF EMBODIMENTS

Figure 1:
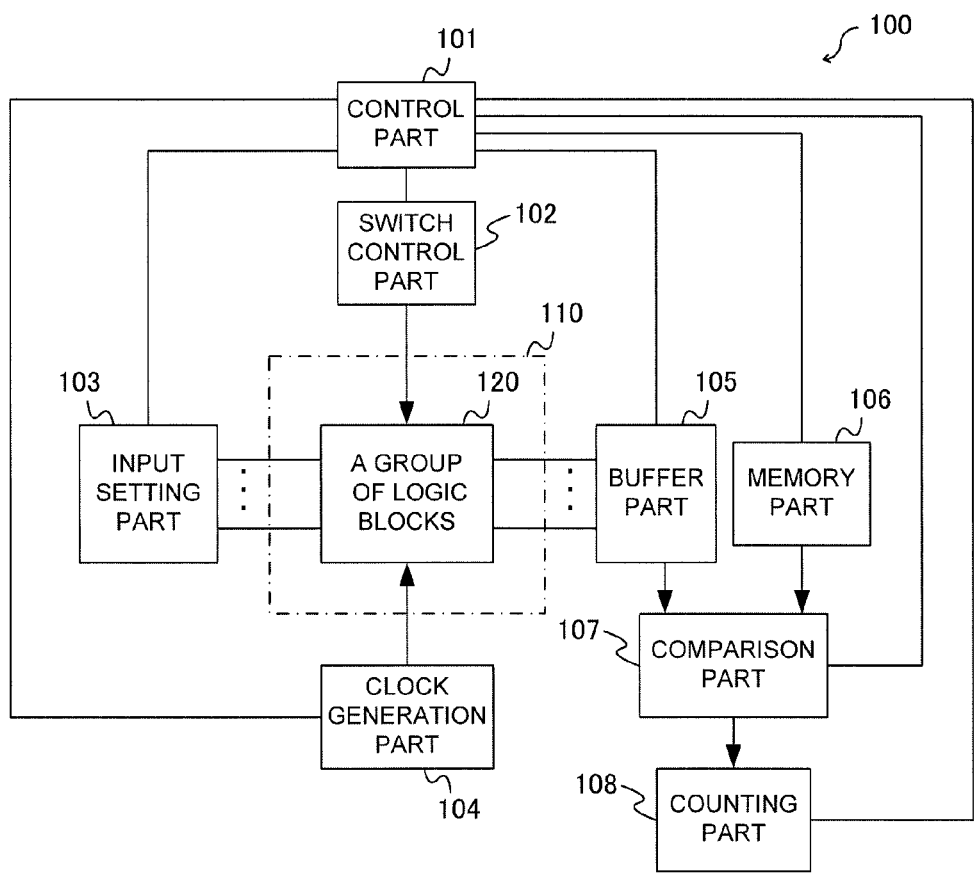
FIG. 1 is a schematic diagram showing a measurement device of a first embodiment.

First, an outline of an embodiment of the present invention will be described.

The inventor has found a mode that can be restored by rewriting, differently from SEL and SEFI, but is accompanied, similarly to SEL, by current increase, and has revealed its mechanism and called it Multi-Coupled Bipolar Interaction (MCBI) (See Non-Patent Document 6).

In the case of 130-nm process SRAM, MCBI ranges over up to 12 bits. However, as for error bits lined up in the WL direction, none among 2500 MCUs ranges over 3 bits or more. Theoretically, as described in the following Document 7 using simulation that does not take into consideration MCBI, it is possible to predict that a perfect countermeasure can be taken against MCBI by having interleave intervals of 3 bits or more in the WL direction and by providing ECC.

Document 7: E. Ibe, H. Kameyama, Y. Yahagi, K. Nishimoto, Y. Takahashi, 'Distinctive Asymmetry in Neutron-Induced Multiple Error Patterns of 0.13 um process SRAM', RASEDA2004, Tsukuba, Oct. 6-8, 2004, pp. 19-23 (2004).

On the other hand, as for logic devices represented for example by a flip-flop (hereinafter also referred to as FF), error tolerance becomes inferior as scaling develops. In the case of the 70 nm process, it is said that their error tolerance becomes equal to that of SRAM (See Document 8 mentioned below).

Document 8: P. Shivakumar (University of Texas at Austin), M. Kistler, W Keckler. S, Doug Burger, Lorenzo. A., "Modeling the Effect of Technology Trends on the Soft Error Rate of Combinational Logic", Int'l Conf. on Dependable Systems and Networks, pp. 389-398 (2002).

At present, in distinction from a memory provided with ECC, a logic device does not have a countermeasure against an error. Further, it is not practical to employ a redundant system such as DMR, TMR or the like all over the system, since it entails twofold or threefold overhead.

As for as FF is concerned, a device DICE has been developed. In a device DICE, two physical nodes are provided to one logic node so that its logic state is not changed unless states of two nodes are changed at the same time. Thus, a device DICE is said to be "soft-error immune". However, it is warned that, when scaling develops further to 45-32 nm, the probability that two nodes get errors simultaneously rises to the same degree as in the case of an FF for which no countermeasure has been taken (See Document 9 mentioned below).

Document 9: N. Seifert, V. Zia, "Assessing the impact of scaling on the efficacy of spatial redundancy based mitigation schemes for terrestrial applications", IEEE Workshop on Silicon Errors in Logic—System Effects 3, Austin Tex., Apr. 3, 4 (2007).

In the case of MCBI, all adjacent "high" nodes in one p-well get errors, and thus such countermeasure has no effect. As a countermeasure, it is possible to expand the space between two physical nodes of a logic node or to arrange them in different wells. This, however, incurs area penalty or circuit complexity, and is not the best countermeasure.

Further, in the case of an electronic system loaded with a huge number of memories and various logic devices, such as a server, a router, a car-mounted Micro Control Unit (MCU) or the like, a malfunction leads to a threat to safety or large economic loss. Thus it is necessary to design a system so as to keep malfunction particularly due to environmental neutron ray under the demand level.

As for memories such as SRAM and DRAM, there are internationally-recognized standard test methods represented by one described in the following Document 10. By using values measured in accordance with such method and by conducting calculation according to the designated calculation procedure, it is possible to obtain a soft-error rate $SER_i$ for each device itself.

Document 10: JEDEC, J., "Measurement and Reporting of Alpha Particles and Terrestrial Cosmic Ray-Induced Soft Errors in Semiconductor Devices: JESD89A", JEDEC STANDARD, JEDEC Sold State Technology Association, No. 89, pp. 1-85 (2006).

Then, from this soft-error rate $SER_i$, it is possible to calculate a soft-error rate SSER due to the memories of an electronic system according to the following equation (1).

(Eq. 1)

$$SSER = \sum_i \rho_i N_i SER_i \quad (1)$$

Here, $SER_i$ denotes a soft-error rate of one bit of an i-type memory, $N_i$ a total number of i-type memories used in the electronic system, and $\rho_i$ an operating rate (utilization ratio) of the i-type memories. Further, $SER_i$ can be written as follows by using an incidence frequency (hereinafter referred to as flux) $\phi$ of incident particles (such as neutrons and ions) per unit time and unit area and by using an SEU cross-section area $\sigma$SEU,i (error probability for unit flux, having area dimension) of the memory device concerned.

(Eq. 2)

$$SERi = \phi \sigma SEU,i \quad (2)$$

Here, $\sigma$SEU,i is a value indicating an error tolerance that is specific to an individual memory circuit In the case of errors in logic devices, a sequential circuit (including a memory element) such as a flip-flop is similar to a memory in that an error occurs in itself when a secondary ion hits it. On the other hand, a noise caused by an environmental neutron in a combinational logic device having no memory element causes an error at the time the noise is latched (taken in) by a flip-flop. This mode is called Single Event Transient (SET). It is said that SET and an error latched by an FF ultimately decay or disappear as an output error of an electronic system owing to the masking effects of the following three types (1)-(3) of logic devices.

(1) Logic Masking: Even if a noise of the level "1" instead of correct "0" is entered to one input of an AND circuit, an AND output becomes the originally-expected value "0" when the other input of the AND circuit is "0", and thus the noise entered into the AND circuit disappears. Such effect of noise cancelling depending on a logic state of a logic gate (a unit component circuit of a logic device such as AND, OR, NOR, NAND, XOR or the like) is called logic masking.

(2) Timing Masking: When input control is performed by synchronizing an FF with a clock signal, an input value is taken into the FF synchronously with the leading or trailing edge of the clock signal. Thus if a noise does not enter an input terminal at the time of taking-in, that noise is not taken into the FF and thus disappears. This effect is called timing masking.

(3) Electric Masking: A generated noise attenuates as it transmits through a circuit. If the noise attenuates to the level equal to the original logic state, it means that the noise practically has disappeared. This is called electric masking.

In addition, cases have been reported in which generation of noise in a clock system gives a pseudo clock signal, or deformation of a clock signal causes a change in timing, which in turn leads to taking-in error in an FF (See Document 11 mentioned below).

Document 11: Seifert, N., Shipley, P., Pant, M. D., Ambrose, V., and Gill, B., "Radiation-Induced Clock Jitter and Race", 2005 IEEE International Reliability Physics Symposium Proceedings, April 17-21, San Jose, Apr. 17-21, 2005, Vol. 43rd Annual, pp. 215-222 (2005).

In system tolerance design, it is necessary in principle to consider all of the above-described masking effects in order to obtain an error rate of an electronic system. However, such approach is extremely difficult, since a logical path changes depending on applications and different gates have different operating rates. Thus, there is an approach that performs analysis by using a netlist for circuit simulation such as SPICE (See Document 12 in the following). This, however, is not a practical solution, since it takes much time, and a slight change in circuit requires reevaluation from the beginning.

Document 12: Uemura, T., Tosaka, Y., and Satoh, S., "Neutron-induced Soft-Error Simulation Technology for Logic Circuit s", SSDM2005, International Conference Center Kobe, Sep. 13-15, Vol. D9, No. 3, pp. 942-943 (2005).

As a simple evaluation method substituting for this, recently it begins to employ the following method (See Document 13 in the following).

Document 13: Rivers, J. A., Bose, P., Kudva, P., Wellman, J.-D., Sanda, P. N., Cannon, E. H., Alves, L. C., "Phaser: Phased methodology for modeling the system-level effects of soft errors", IBM J. Res. Develop., Vol. 52, No. 3, pp. 293-306 (2008).

In the present invention fault is distinguished from error by defining them as follows.

Fault: a noise that is generated due to incidence of a high-energy particle, which occurs in a specific part of a circuit, and that has sufficient wave height and pulse width to cause an error if there is no masking effect.

Error: appearance of an incorrect value as a result of propagation of a fault to at least a part of output of a circuit block or a device as a whole.

(1) Obtaining of a fault rate $FR_i$ of each logic gate. Here, it is assumed that each fault rate is obtained experimentally by simulation or the like.

(2) Obtaining a masking coefficient pi of each logic gate when the electronic system concerned is seen as a whole. This also is obtained by simulation or experiment.

(3) An error rate SSER of the electronic system as a whole is obtained as summation of the above by calculating it according to the following equation (3).

(Eq. 3)

$$SSER = \sum_i \rho_i (1-\mu_i) N_i FR_i \quad (3)$$

That is to say, in practice, the memories and logic gates used in the electronic system are listed, so as to make a table of the above values of each device. Then, the summation can be calculated by using a spreadsheet or the like. Each masking coefficient pi cannot be simply determined so that an empirical value is employed initially, and its degree of accuracy is improved by accumulation of data. Also $FR_i$ can be written as follows similarly to SERi of a memory.

(Eq. 4)

$$FRi = \phi \sigma SET,i \quad (4)$$

Here, $\sigma$SET,i is a value indicating error tolerance specific to each logic device. A concrete object of the present invention is to obtain this value.

However, the largest problem of this method lies in the part (1) in which the fault rate $FR_i$ of each logic gate is obtained.

When simulation is employed, each fault rate $FR_i$ cannot be obtained unless a three-dimensional model of a logic gate, which itself includes many transistors, is constructed to perform Monte Carlo calculation. Further, also it is accompanied with large difficulty to reflect its internal logic state in the simulation. In the case of an experimental method, up to now there is no general method of evaluating a fault rate $FR_i$ of each logic gate individually.

As for an inverter, the following Document 14 discloses a method of obtaining a fault rate of an inverter.

Document 14: Benedetto, J., Eaton, P., Avery, K., Mavis, D., Gadlage, M., and Turflinger, T., "Heavy Ion Induced Digital Single-Event Transients in Deep Submicron Processes", 2004 Nuclear and Space Radiation Effects Conference, Atlanta, Ga., July 20-24, No. E-5 (2004).

In detail, this method is performed as follows. A serial chain of inverters is formed, and FFs each called DICE (which is said to have perfect soft-error tolerance) are disposed between the chain of inverters. While making the clock operate, neutrons are irradiated and data of the FFs are monitored. If an error occurs, it is counted as an error in an inverter, to obtain an error tolerance value This method is limited to an inverter, and a method of evaluating another logic gate is not disclosed. Further, even in the case of a dual-system FF such as DICE, high tolerance is impaired when two related nodes simultaneously get errors. The above-mentioned Document 9 shows that this tendency is becoming remarkable. Thus, this method does not have broader utility.

On the basis of the above-outlined situation, embodiments of the present invention will be described in the following.

FIG. 1 is a schematic diagram showing a measurement device 100 of a first embodiment of the present invention. As shown in the figure, the measurement device 100 comprises a control part 101, a switch control part 102, an input setting part 103, a clock generation part 104, a buffer part 105, a memory part 106, a comparison part 107, and a counting part 108. The measurement device 100 is arranged such that it can measure an error rate of a group 120 of logic blocks by locating the group 120 of logic groups as a measuring object in an irradiation area 110 of a high-energy particle irradiation device not shown in the figure. Here, particles irradiated by the high-energy particle irradiation device may be ions or neutrons.

The control part 101 controls all of processing in the measurement device 100. For example, it controls processing in the below-described switch control part 102, and controls operation and operation timing of switches included in the below-described group 120 of logic blocks.

Further, the control part 101 controls processing in the input setting part 103, and controls information (signals) inputted from the input setting part 103 into logic blocks and sequential circuits included in the below-described group 120 of logic blocks.

Further, the control part 101 controls processing in the clock generation part 104, and controls a clock signal inputted from the clock generation part 104 into the sequential circuits included in the below-described group 120 of logic blocks.

Further, the control part 101 obtains from the counting part 108 the number of errors in the group 120 of logic blocks as a whole, and obtains from the counting part 108 the number of errors in the case where a logic block among the group 120 of logic blocks is bypassed. Then, the control part 101 calculates an error rate of the logic devices included in the logic block in question by subtracting the number of errors in the case of bypassing the logic block from the number of errors as a whole so as to calculate the number of errors in the logic block in question.

The switch control part 102 controls the switches included in the below-described group 120 of logic blocks according to an instruction from the control part 101.

The input setting part 103 controls information (signal) inputted into the sequential circuits and logic blocks included in the below-described group 120 of logic blocks according to an instruction from the control part 101.

The clock generation part 104 controls the clock signal inputted from the clock generation part 104 into the sequential circuits included in the below-described group 120 of logic blocks according to an instruction from the control part 101.

The buffer part 105 stores values outputted from the sequential circuits included in the below-described group 120 of logic blocks.

The memory part 106 stores values outputted from the sequential circuits included in the below-described group 120 of logic blocks when no error occurs.

The comparison part 107 compares a value stored in the buffer part 105 and a value stored in the memory part 106. If these values are different, the comparison part 107 notifies the below-described counting part 108 of occurrence of an error, and notifies the control part 101 of the error occurrence and information specifying the location of error occurrence (i.e. the sequential circuit that outputted the error).

The control part 107 that received such notification of error responds to the notification in this way. That is to say, on receiving information (signal) indicating occurrence of error from the comparison part 107, the control part 101 performs processing of controlling a set or reset signal that is inputted from the input setting part 103 into the sequential circuits included in the below-described group 120 of logic blocks, such that the value outputted from the sequential circuit that outputted the erroneous value returns to the legitimate value (i.e. the value in the case of no error).

The counting part 108 counts the number of errors in response to notification from the comparison part 107.

Figure 2:
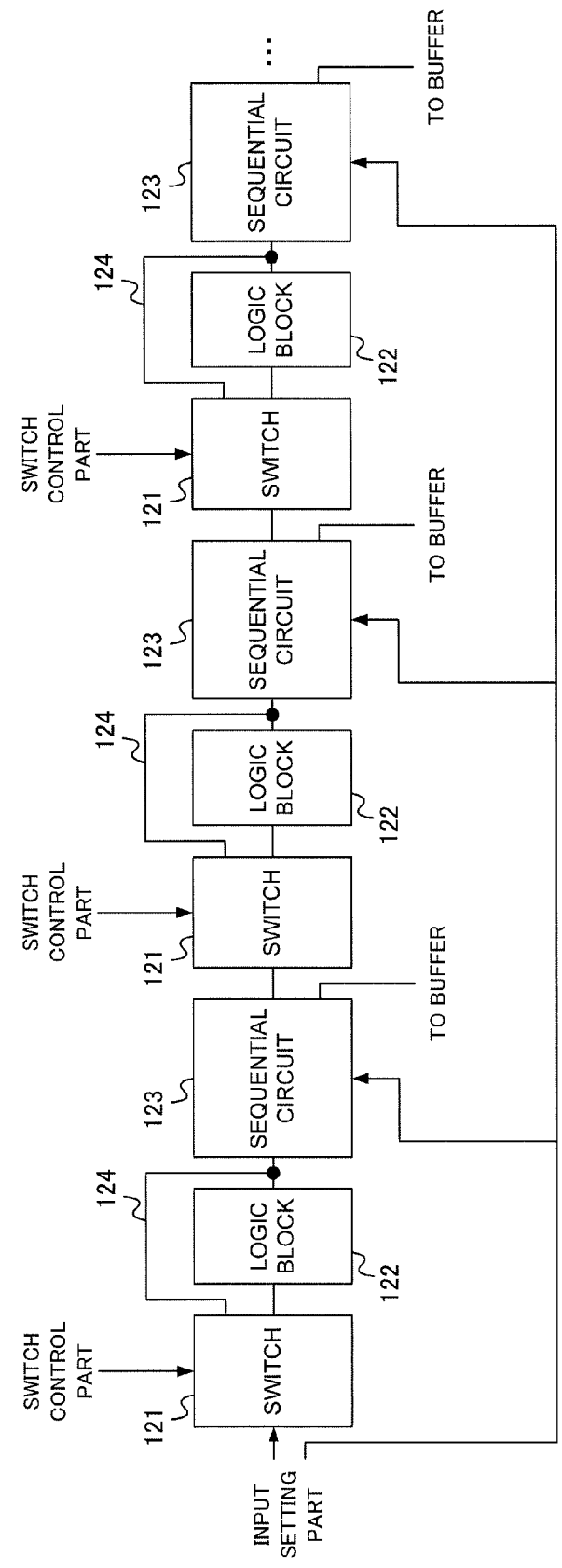
FIG. 2 is a schematic diagram showing a group of logic blocks.

FIG. 2 is a schematic diagram showing the group 120 of logic blocks. As shown in the figure, the group 120 of logic blocks comprises at least one combination of a switch 121, a logic block 122, a sequential circuit 123, and a bypass 124. In the present embodiment, one combination of a switch 121, a logic block 122, a sequential circuit 123, and a bypass 124 is referred to as a stage.

Each switch 121 changes a destination of input of specific information (signal) between the logic block 122 and the sequential circuit 123 by bypassing the logic block 122. Turning of the switch 121 is controlled by the switch control part 102.

Each logic block 122 has at least one logic device.

Depending on a turned state of the switch 121, each sequential circuit 123 stores a value outputted from the logic block 122 or a value outputted from the previous stage or the input setting part 103, and outputs a value corresponding to the stored value to the buffer part 105.

Depending on a turned state of the switch 121 concerned, each bypass 124 inputs information (signal) into an input terminal of the sequential circuit 123 by bypassing the logic block 122.

Now, processing in the measurement device 100 of the above configuration will be described.

A group 120 of logic blocks as a measuring object is placed in the irradiation area 110.

Next, the control part 101 makes the switch control part 102 control each of all the switches 121 included in the group 120 of logic blocks so that information (signal) is inputted into the logic block 122 concerned.

Then, the control part 101 controls the high-energy particle irradiation device to irradiate the group 120 of logic blocks with high-energy particles.

Next, the control part 101 makes the input setting part 103 input predetermined information (signal) into the group 120 of logic blocks so that outputs of the sequential circuits 123 are stored in the buffer part 105.

As for the thus-stored values in the buffer part 105, the comparison part 107 compares them with output values (expected values) in the case of no error, which are stored in the memory part 106. This comparison is performed in the order of stage's distance from the input setting part 103 from nearest to most distant. When these sets of values do not coincide, the comparison part 107 sends an error notification to the counting part 108, and further sends to the control part 101 an error notification together with information specifying the sequential circuit that has outputted the erroneous value.

Receiving such an error notification, the counting part 108 increments the number N of errors by one.

Further, receiving such an error notification, the control part 101 instructs the input setting part 103 to perform reset so as to make the output value of the sequential circuit 123 that has outputted the erroneous value become the output value in the case of no error.

After the above processing is performed for all the stages included in the group 120 of logic blocks, the control part 101 obtains the number N of errors counted in the counting part 108, and resets the counting part 108 to "0".

Next, the control part 101 instructs the switch control part 102 to control each of all the switch 121 included in the group 120 of logic blocks so that information (signal) is not inputted into (i.e. bypasses) the logic block 122 concerned.

According to such an instruction, each switch 121 turns from the path through which information (signal) flows to the bypass 124.

Then, the control part 101 controls the high-energy particle irradiation device to irradiate the group 120 of logic blocks with high-energy particles.

Next, the control part 101 makes the input setting part 103 input predetermined information (signal) into the group 120 of logic blocks so that outputs of the sequential circuits 123 are stored in the buffer part 105.

As for the thus-stored values in the buffer part 105, the comparison part 107 compares them with output values (expected values) in the case of no error, which are stored in the memory part 106. This comparison is performed in the order of stage's distance from the input setting part 103 from nearest to most distant. When these sets of values do not coincide, the comparison part 107 sends an error notification to the counting part 108, and further sends to the control part 101 an error notification together with information specifying the sequential circuit that has outputted the erroneous value.

Receiving such an error notification, the counting part 108 increments the number N* of errors by one.

Further, receiving such an error notification, the control part 101 instructs the input setting part 103 to perform reset so as to make the output value of the sequential circuit 123 that has outputted the erroneous value become the output value in the case of no error.

After the above processing is performed for all the stages included in the group 120 of logic blocks, the control part 101 obtains the number N* of errors counted in the counting part 108, and resets the counting part 108 to "0".

To the number N of errors counted in the measurement device 100, the following correction is performed. Here, it is assumed that the number of logic devices included in one logic block 122 is n, a latency per one logic device $\tau_0$, a time during which a window of the sequential circuit 123 is open $\omega$, a clock cycle $\tau$, and width of noise generated by incident particle t. In detail, in a logic device, connection of MOS transistors is determined so as to realize a desired logic state as a whole in such a way that a line connected to the source or the drain of a MOS transistor is connected on the other end to the gate of a subsequent MOS transistor. If a transiently-generated SET pulse is sufficient in its height and width t for inverting a logic state of a gate included in a logic device, a logic state of the subsequent circuit is inverted unless a special protection circuit is built in, and thus data stored until just before in the sequential circuit 123 is also inverted. The average probability p of data inversion can be calculated by the following Eq. (3). Assuming that the clock cycle $\tau$ is larger than the latency n$\tau$0 of the block as a whole and error counting is performed during a time that does not exceed n$\tau$0 from the time the window is opened (if not, counting of an error generated in the preceding stage occurs), p=1 when t>$\tau$. Otherwise:

Eq. (5)

$$p = \frac{(\varpi + t)}{\tau} \quad (5)$$

And, the total number $N_T$ of errors including a SET pulse actually occur and masked by the window masking can be obtained by the following Eq. (6).

Eq. (6)

$$N_T = \frac{N}{p} \quad (6)$$

Further, an SET cross-section area $\sigma$SET per 1 mega cell of this logic gate can be obtained as:

Eq. (7)

$$\sigma_{SET} = \frac{N_T}{\Phi L} \quad (7)$$

This SET cross-section area is obtained as a characteristic value of this logic gate.

Here, $\Phi$ is an fluence (number/cm$^2$) of neutrons. Sometimes the above value should be corrected by considering further the width and height of a generated pulse. However, a distribution function of the width and height is intrinsic to a device, and thus ordinarily correction is not necessary.

In the case where the high-energy particles are neutrons, there are Quasi-monoenergetic neutron method and Spallation neutron method depending on the energy spectrum of the used neutrons. For each method, it is possible to obtain a fault rate $FR_i$ per one cell of a logic device by the method described in the above-mentioned Document 10. From such fault rates $FR_i$, it is possible to obtain the error rate SER of a specific electronic device or system by the above-mentioned Eq. (3).

Figure 3:
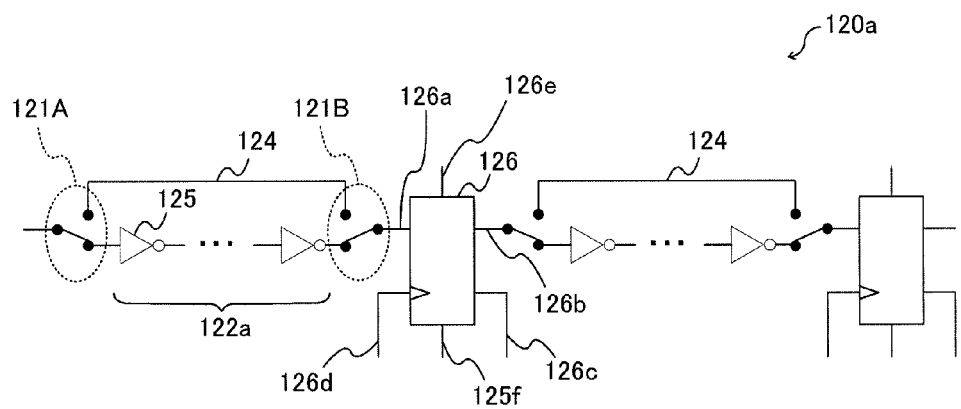
FIG. 3 is a schematic diagram showing a specific example of a group of logic blocks.

The group 120 of logic blocks can be constructed for example as a group 120a of logic blocks as shown in FIG. 3 (a schematic diagram of the group 120a of logic blocks).

As shown in the figure, the group 120a of logic blocks comprises switches 121A, 120B, logic blocks 122a each having at least one inverter 125, and flip-flops 126.

Owing to the switches 121A, 121B, it is possible to select a path for inputting information (signal) into the logic block 122a or a path (bypass 124) for bypassing information (signal) without inputting it into the logic block 122a depending on a control signal from the switch control part 102.

Each logic block 122a is constructed by connecting a plurality of inverters 125 in series. When it is assumed that input of the first (top) inverter 125 is "1", then input of the next inverter 125 is "0". In this way, inputs of the inverters alternate between "1" and "0".

Each flip-flop 126 comprises an input terminal 126a, a first output terminal 126b, a second output terminal 126c, a clock terminal 126d, a set terminal 126e, and a reset terminal 126f.

The input terminal 126a is connected to the logic block 122a positioned before the flip-flop 126. The first output terminal 126b is connected to the logic block 122a positioned after the flip-flop 126. The second output terminal 126c is connected to the buffer part 105.

Further, the clock terminal 126d is connected to the clock generation part 104, and the set terminal 126e and the reset terminal 126f are connected to the input setting part 103.

If, in the thus-constructed group 120a of logic blocks, the number of inverters included in each logic block 122a is even, all inputs into the flip-flops 126 are "1" or "0" depending on the input into the top inverter 125. If an error occurs in some place of a logic block 122a, then the value of the flip-flop 126 just after the logic block 122a in question is inverted after input of a clock signal from the clock terminal 126d, making it possible to judge that an error has occurred.

If the statistically-sufficient number of errors can be obtained, a predetermined signal is inputted through the set terminal 126e or the reset terminal 126f, to return the value of the flip-flop 126 to the correct value.

Figure 4:
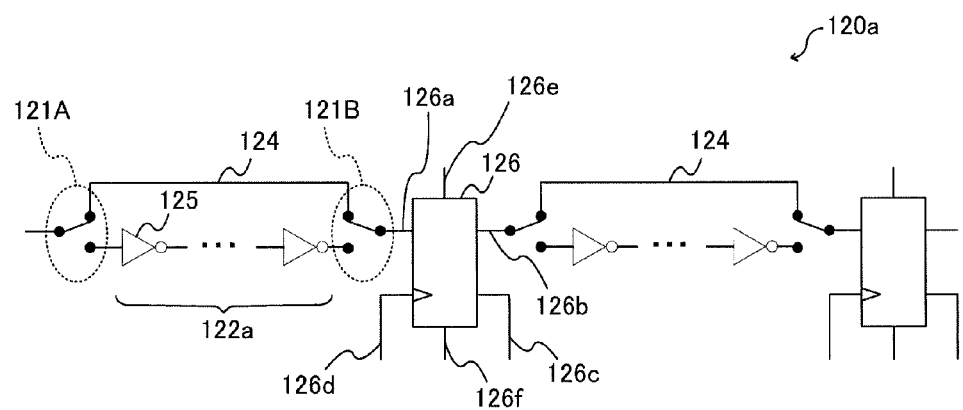
FIG. 4 is a schematic diagram showing a specific example of a group of logic blocks.

Next, as shown in FIG. 4 (a schematic diagram showing the specific example of the group 120a of logic blocks), all the switches 121A, 121B are changed to the sides on which the logic blocks 122a are bypassed (i.e. the side of the bypasses 124), in order to measure the number of errors only in the flip-flops 126.

It is possible to obtain the number of errors only in the first logic block 122a by subtracting the number of errors only in the flip-flops 126 from the value (the number of errors) including errors in both the first logic block 122a and the flip-flops 126. From this value, it is possible to calculate the error rate for only the logic block 122a. By dividing it by the total number of the inverters 125, it is possible to obtain the error rate per one cell of inverter 125.

By varying the frequency or the pulse width of the clock, it is possible to calculate the frequency dependence of the error rate and the window masking coefficient.

Further, by varying as a parameter the number of inverters between flip-flops, it is possible to measure the electric masking effect.

Further, when a noise occurrence in the clock system causes a pseudo clock, timing shift of the clock, disappearance of the clock signal or the like, an error may occur in a subsequent stage into which the error enters in the case of an actual electronic device or system. As for the present invention, however, even if there is shift of timing or input of a pseudo clock, data held in each position do not change and thus such an event is not counted as an error.

When a noise enters into the set terminal 126e or the reset terminal 126f, it is counted as an error. Thus, in the course of irradiation, it is necessary to keep the set and reset terminals 126e and 126f in an inactive state (for example, a ground state or a float state). By comparing an error rate in such a state with the error rate in an active state, it is possible to estimate an error rate in the set terminal 126e or the reset terminal 126f. In the case of an actual electronic device or system, such an error rate can be analyzed separately on the basis of a circuit configuration of the set terminal 126e or the reset terminal 126f according to the present invention.

Thus, according to the present invention, it is possible to obtain also an error rate of a flip-flop to be used actually in an electronic circuit or system, differently from the above Document 14 that uses a flip-flop provided with redundancy to increase soft-error tolerance extremely.

Further, as pointed out in the above Document 9, tolerance of a highly-tolerant flip-flop reduces drastically as scaling of semiconductor devices develops. Thus, the method using a highly-tolerant flip-flop does not become a more effective measurement method than the method of the present invention.

Figure 5:
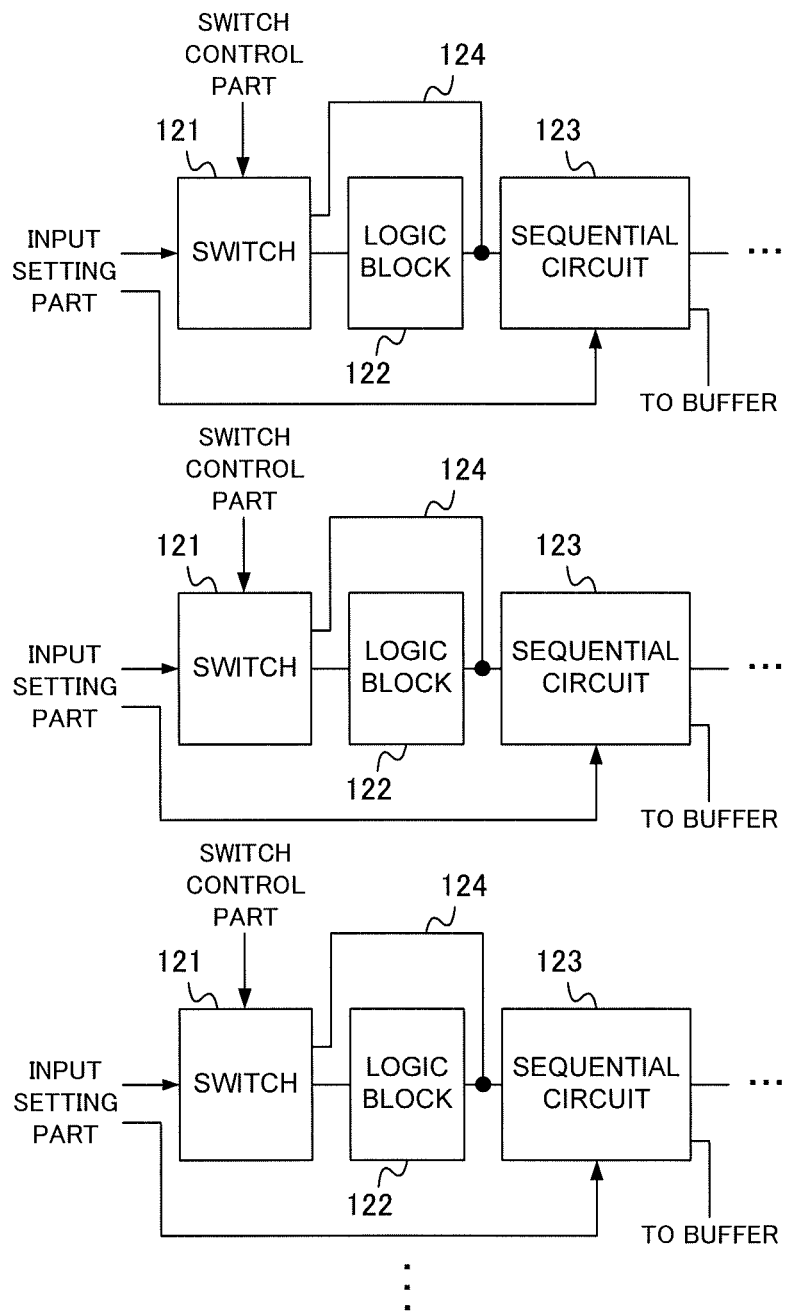
FIG. 5 is a schematic diagram showing a variation of a group of logic blocks.

In the above-described embodiment, combinations each consisting of a switch 121, a logic block 122, and a sequential circuit 123 are connected in series. However, for example as shown in FIG. 5 (a schematic diagram showing a variation of a group of logic blocks), combinations each consisting of a switch 121, a logic block 122, and a sequential circuit 123 can be connected in parallel.

Figure 6:
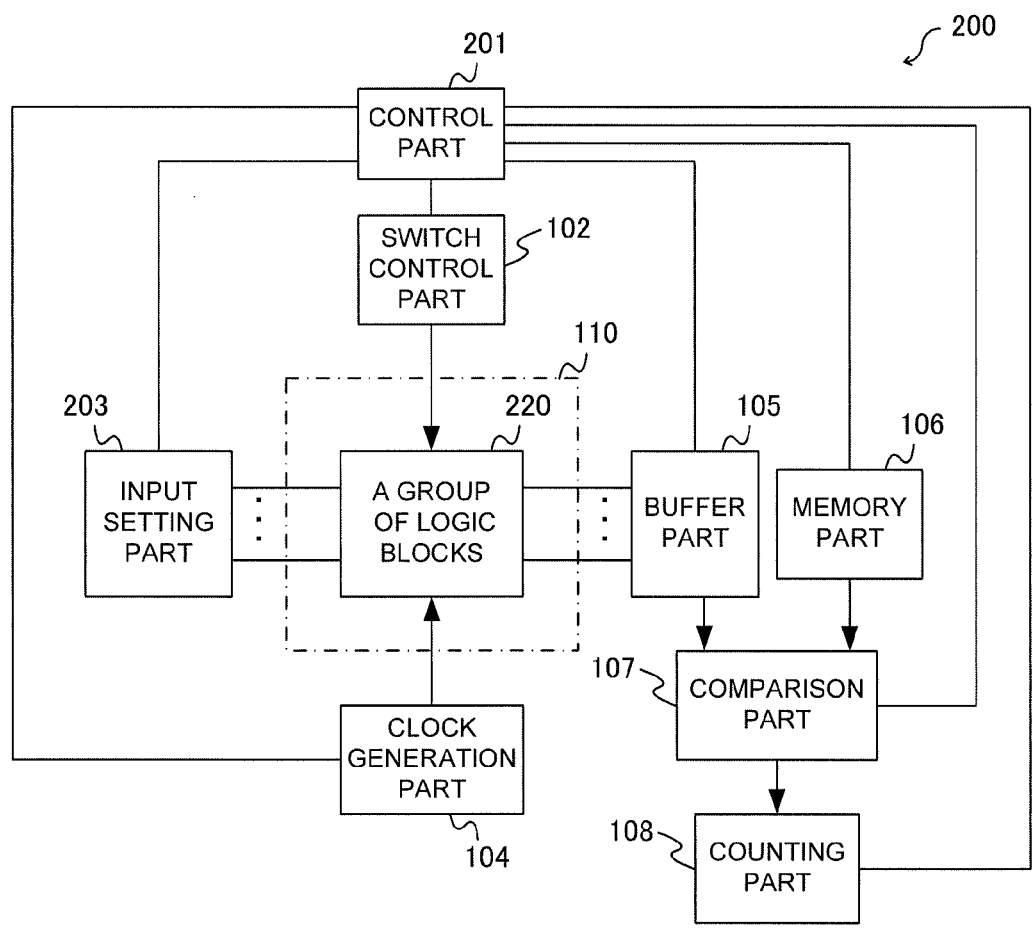
FIG. 6 is a schematic diagram showing a measurement device of a second embodiment.

FIG. 6 is a schematic diagram showing a measurement device 200 of a second embodiment of the present invention. As shown in the figure, the measurement device 200 comprises a control part 201, a switch control part 102, an input setting part 203, a clock generation part 104, a buffer part 105, a memory part 106, a comparison part 107, and a counting part 108. The measurement device 200 is arranged such that it can measure an error rate of a group 220 of logic blocks by locating the group 220 of logic blocks as a measuring object in an irradiation area 110 of a high-energy particle irradiation device not shown in the figure.

Here, in comparison with the first embodiment, the measurement device 200 of the second embodiment differs from that of the first embodiment in the control part 201, the input setting part 203, and the group 220 of logic blocks. Thus, in the following, particulars relating to these different components will be described.

The control part 201 of the present embodiment controls, through the input setting part 203, a value (signal) inputted into a specific terminal of a logic device included in the group 220 of logic blocks, in addition to performing processing similar to the first embodiment.

The input setting part 203 of the present embodiment performs processing of inputting a specific value (signal) into a specific terminal of a logic device in response to an instruction from the control part 201, in addition to performing processing similar to the first embodiment.

Figure 7:
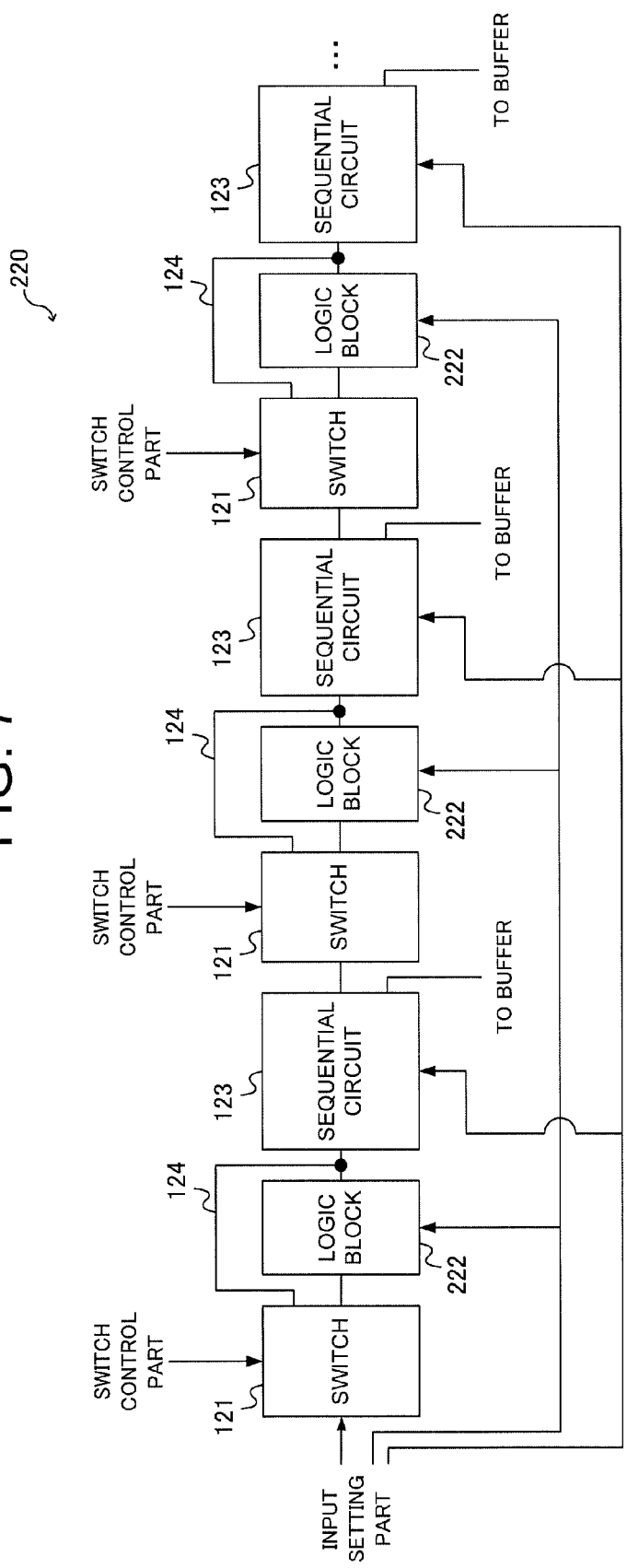
FIG. 7 is a schematic diagram showing a group of logic blocks.

FIG. 7 is a schematic diagram showing the group 220 of logic blocks in the present embodiment. As shown in the figure, the group 220 of logic blocks comprises at least one combination of a switch 121, a logic block 222 and a sequential circuit 123. In comparison from the first embodiment, each logic block 222 is different from that of the first embodiment, and thus particulars relating to each logic block 222 will be described in the following.

Each logic block 222 in the present embodiment comprises at least one logic device. Each logic device in the present embodiment has a plurality of input terminals.

In each logic device in the present embodiment, one terminal among the plurality of input terminals is a variable input terminal and the other terminals are fixed input terminals.

Into the fixed input terminals, a prescribed value (signal) is inputted through the input setting part 103. Into the variable input terminal, a signal from another logic device or a switch is inputted.

Here, the value (signal) inputted into the fixed input terminals shall be predetermined such that a value (signal) outputted from an output terminal changes when a value (signal) inputted into the variable input terminal changes. In other words, a value (signal) that can escape the above-mentioned logic masking is inputted into the fixed input terminals.

Figure 8:
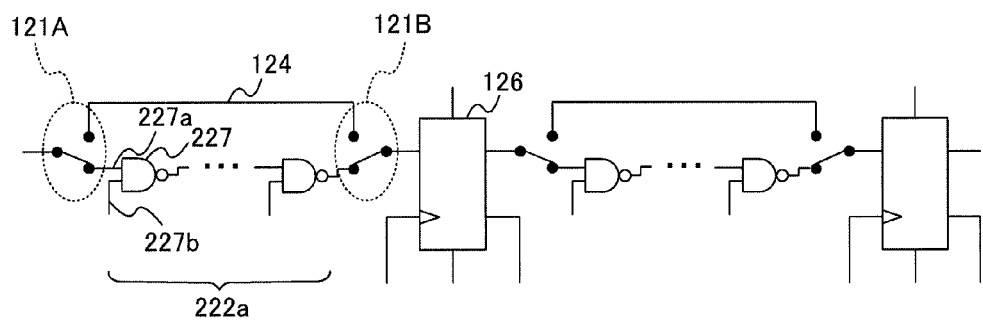
FIG. 8 is a schematic diagram showing a group of logic blocks.

For example, in the case as shown in FIG. 8 (a schematic diagram showing the group 220a of logic blocks) where each logic block 222a consists of NAND circuits 227, one input terminal 227a of each NAND circuit 227 is determined as a variable input terminal and the other input terminal 227b as a fixed input terminal. If input into each variable input terminal is held "0" and input into each fixed input terminal is fixed at "1", then, as for outputs of the NAND circuits 227 connected in series, all outputs at positions of odd numbers counting from the top switch 121A are "1", and all outputs at positions of even numbers are "0". Thus, the expected value of input into a flip-flop 126 is determined by the number of NAND circuits 227 included in the logic block 222a located just before the flip-flop 126.

If a fault occurs in a NAND circuit 227a included in a logic block 222a, then all outputs after the NAND circuit 227a in question are inverted and thus the input value into the flip-flop 126 is also inverted, making error judgment possible.

Figure 9:
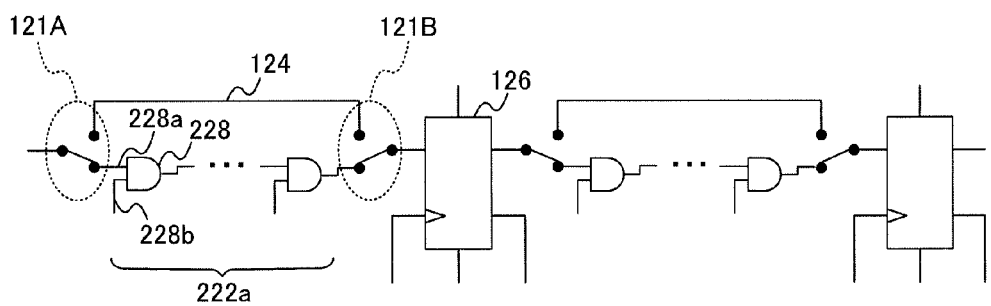
FIG. 9 is a schematic diagram showing a group of logic blocks.

Further, for example in the case as shown in FIG. 9 (a schematic diagram showing the group 220a of logic blocks) where each logic block 222a consists of AND circuits 228, one terminal 228a of each AND circuit 228 is determined as a variable input terminal and the other input terminal 228b as a fixed input terminal. When "1" is inputted into each variable input terminal and "1" into each fixed input terminal, then all the outputs of the AND circuits 228 are "1".

If a fault occurs in some AND circuit 228 included in a logic block 222a, then all outputs of the subsequent AND circuits 228 included in the logic block 222a are inverted to "0", making error judgment possible.

Figure 10:
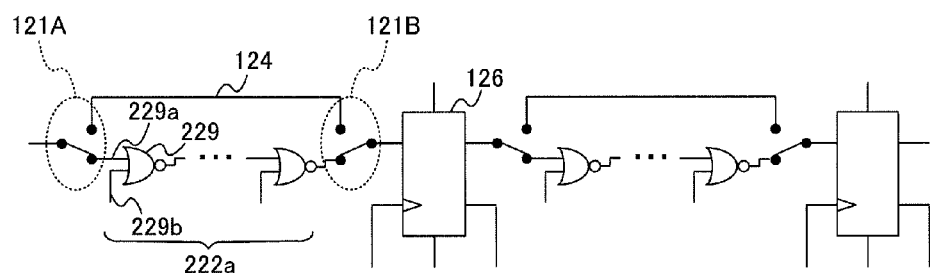
FIG. 10 is a schematic diagram showing a group of logic blocks.

Further, for example in the case as shown in FIG. 10 (a schematic diagram showing the group 220a of logic blocks) where each logic block 222a consists of NOR circuits 229, one terminal 229a of each NOR circuit 229 is determined as a variable input terminal and the other input terminal 229b as a fixed input terminal. When "0" is inputted into the variable input terminal at the head of a logic block 222a and "0" into each fixed input terminal, then "0" and "1" appear alternately as outputs of the NOR circuits 229, making error judgment possible as in the case of the NAND circuits.

Figure 11:
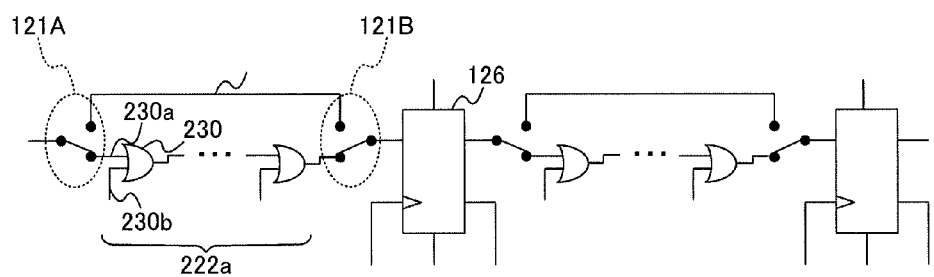
FIG. 11 is a schematic diagram showing a group of logic blocks.

Further, for example in the case as shown in FIG. 11 (a schematic diagram showing the group 220a of logic blocks) where each logic block 222a consists of OR circuits 230, one terminal 230a of each OR circuit 230 is determined as a variable input terminal and the other input terminal 230b as a fixed input terminal. When "0" is inputted into the variable input terminal at the head of a logic block 222a, and "0" into each fixed input terminal, then all outputs of the OR circuits 230 are "0". If a fault occurs in some OR circuit, then all outputs of the OR circuits 230 after the OR circuit in question in the same logic block 222a are "1", making error judgment possible. Also, in the case of XOR circuits or the like, error judgment is possible by a similar method.

Figures 12, 13:
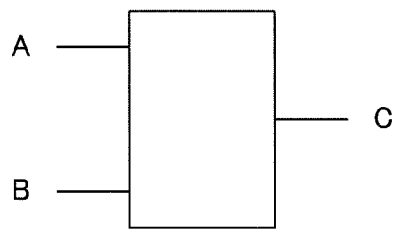
FIG. 12 is a schematic diagram showing a two-input logic device.
FIG. 13 is a schematic diagram showing input examples that make error judgment possible.

As for a two-input logic device as shown in FIG. 12 (a schematic diagram showing a two-input logic device), FIG. 13 (a schematic diagram showing input examples making error judgment possible) shows examples of combination of input into a variable input terminal and input to a fixed input terminal, which make error judgment possible.

Here, for a two-input logic device, the column A shows an example of input into the variable input terminal, the column B an example of input into the fixed input terminal, and the column C an example of output from the output terminal. In FIG. 13, the column of "Correct" in the column C shows an example of output when there is no error, the column of "Incorrect" an example of output when there is an error.

Figures 14, 15:
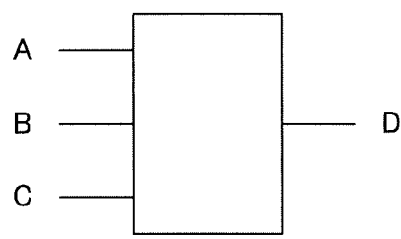
FIG. 14 is a schematic diagram showing a three-input logic device.
FIG. 15 is a schematic diagram showing input examples that make error judgment possible.

Further, as for a three-input logic device as shown in FIG. 14 (a schematic diagram showing a three-input logic device), FIG. 15 (a schematic diagram showing input examples that make error judgment possible) shows examples of combination of input into a variable input terminal and input into a fixed input terminal, which make error judgment possible.

Here, for a three-input logic device, the column A shows an example of input to the variable input terminal, the columns B and C examples of input to the fixed input terminals, and the column D an example of output from the output terminal. In FIG. 15, the column of "Correct" of D (the output terminal) shows an example of output when there is no error, the column of "Incorrect" an example of output when there is an error.

Other than the examples shown in FIGS. 13 and 15, it is possible to give combinations of input into a variable input terminal and input into a fixed input terminal (or terminals), which make error judgment possible, also by changing input into a fixed input terminal between "1" and "0" alternately according to the number of logic devices included in the logic block 222.

Further, more complex combinational circuit can be used as a logic block 222 in the present embodiment.

Figures 16, 17:
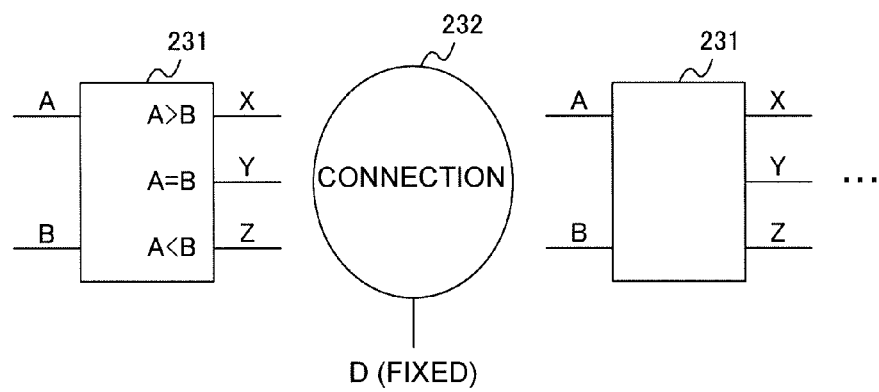
FIG. 16 is a schematic diagram showing a two-input comparison circuit.
FIG. 17 is a schematic diagram showing input examples that make error judgment possible.

For example, a logic block 222 can be constructed also from two-input comparison circuits 231 as shown in FIG. 16 (a schematic diagram showing a two-input comparison circuit 231).

Here, each two-input comparison circuit 231 is a circuit that compares values of input A and input B, and outputs X, Y and Z such that $(X, Y, Z)=(1, 0, 0)$ when A>B, $(X, Y, Z)=(0, 1, 0)$ when A=B, and $(X, Y, Z)=(0, 0, 1)$ when A<B.

In the case of two-input comparison circuits connected in series, the way the input terminals A and B are connected in a connecting part 232 with the output terminals X, Y and Z and a fixed value terminal D is changed as shown in the table of FIG. 17 (a schematic diagram showing input examples that make error judgment possible) according to inputs into the variable input terminals and input into the fixed input terminal.

For example, in the case where A=B=1 and the Y terminal is connected to the variable input A of the next logic block, outputs of the Y terminals become "0" for the two-input comparison circuit 231 in which a fault occurs and the subsequent two-input comparison circuits 231 in the same logic block 222. This makes error judgment possible.

This method deals with only the case where a fault occurs in the Y terminal. However, by performing similar measurement for all the terminals X, Y and Z and summing up the results, it is possible to obtain an error rate of the two-input comparison circuit 231.

Figures 18, 19:
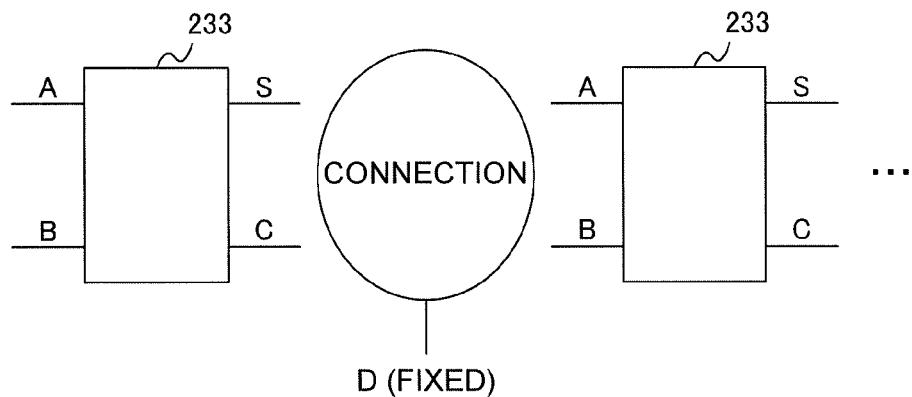
FIG. 18 is a schematic diagram showing half adders.
FIG. 19 is a schematic diagram showing input examples that make error judgment possible.

Further, a logic block 222 can be constructed also from half-adders 233 as shown in FIG. 18 (a schematic diagram showing half-adders) for example.

As for the output S and the output C in a half-adder 233: (S, C)=(0, 0) when (A, B)=(0, 0) for the input A and the input B; (S, C)=(0, 1) when (A, B)=(0, 1); (S, C)=(1, 0) when (A, B)=(1, 0); and (S, C)=(1, 1) when (A, B)=(1, 1).

In this case also, it is possible to calculate an error rate by setting the inputs A, B into the variable input terminals and the input D into the fixed input terminal according to the examples in the table shown in FIG. 19 (a schematic diagram showing input examples that make error judgment possible), to measure error rates for both output terminals S and C, and by summing up both results.

Figure 20:
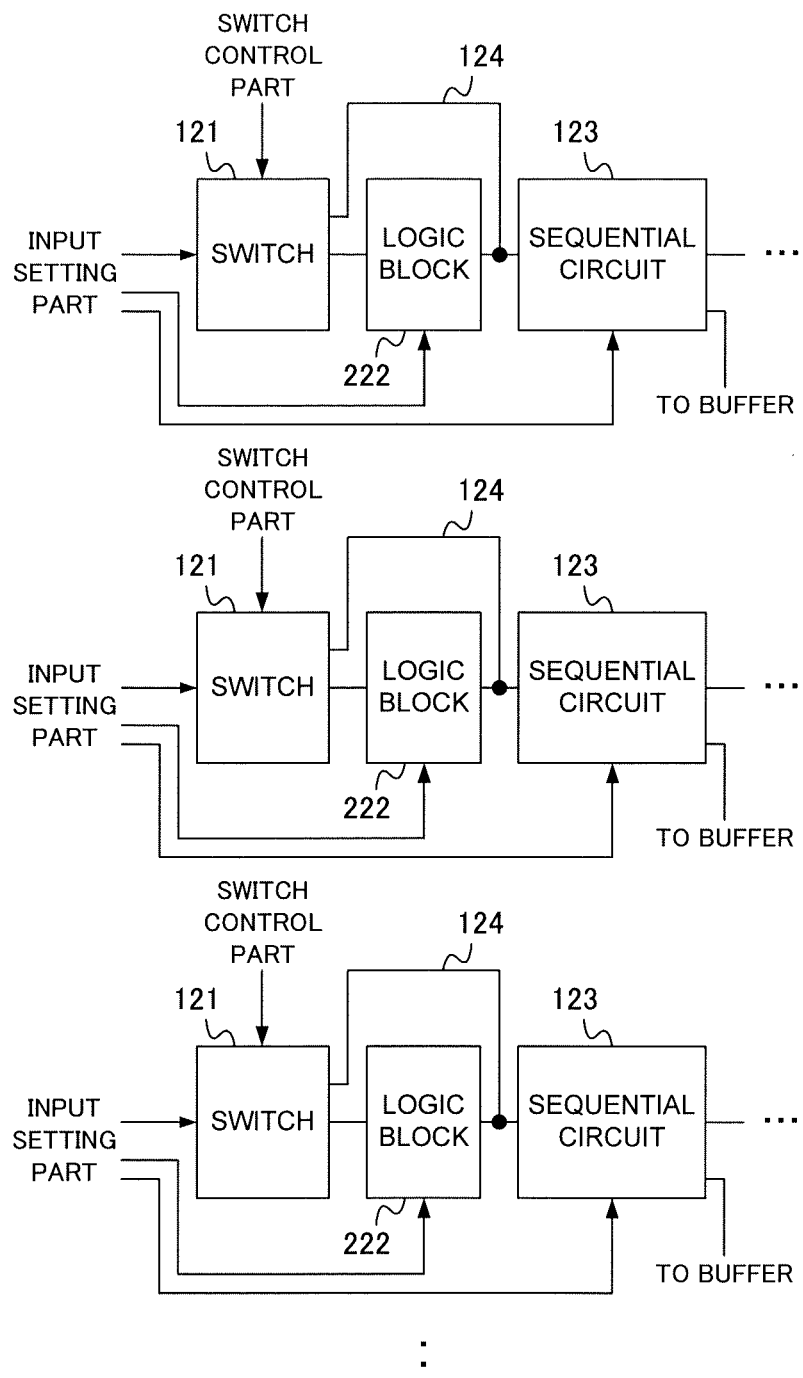
FIG. 20 is a schematic diagram showing a variation of a group of logic blocks.

In the above-described embodiment, combinations each consisting of a switch 121, a logic block 222 and a sequential circuit 123 are connected in series. However, for example as shown in FIG. 20 (a schematic diagram showing a variation of the group 220 of logic blocks), combinations each consisting of a switch 121, a logic block 222 and a sequential circuit 123 can be connected in parallel.

The measurement devices 100, 200 of the embodiments can be implemented by hardware using integrated logic ICs such as Application Specific Integrated Circuit (ASIC), Field Programmable Gate Array (FPGA), or the like. Or the measurement devices 100, 200 can be implemented by software by using Digital Signal Processor (DSP) or the like. Or the measurement devices 100, 200 can be realized on a computer system by using software.

Hereinabove, the present invention has been described in detail on the basis of embodiments. The present invention, however, is not limited to the above embodiments, and can be variously changed without departing from the scope of the invention.

EXPLANATION OF REFERENCES 100, 200 Measurement device
101, 201 Control part
102 Switch control part
103, 203 Input setting part
104 Clock generation part
105 Buffer part
106 Memory part
107 Comparison part
108 Counting part
109 Irradiation area
120, 220 A group of logic blocks

The invention claimed is:

1. A measurement device comprising:
a group of logic blocks, which includes at least one combination of a logic block having at least one logic device, a sequential circuit for receiving, as an input, an output of the logic block, a bypass for bypassing the logic block, and a switch for switching between a path inputting to the logic block and the bypass; and
a control part, which: obtains a first count of errors in the group of logic blocks and sequential circuits under irradiation of high-energy particles when the switch is turned to the path through the group of logic blocks; obtains a second count of errors in the sequential circuits only under irradiation of high-energy particles when the switch is turned to the bypass in parallel with the path through the group of logic blocks; and subtracts the second count of errors from the first count of errors, to calculate an error rate of the logic block and sequential circuits separately based on a count of errors obtained by the subtraction.

2. A measurement device of claim 1, further comprising:
a memory part for storing an expected value from the sequential circuit when an error does not occur in the group of logic blocks;
a comparison part, which judges existence or non-existence of an error by comparing an output value from the sequential circuit with the expected value; and
a counting part, which counts a number of times the comparison part judges an error to exist.

3. A measurement device of claim 1, wherein:
the logic block is a serially-connected logic devices of a same type.

4. A measurement device of claim 3, wherein:
each of the logic devices has a variable input terminal and a fixed input terminal; and
the control part inputs into the fixed input terminal such a value that achieves a change in output of the logic device when input into the variable input terminal changes.

5. A measurement device of one of claim 1, wherein:
in the group of logic blocks, the combinations are connected in series.

6. A measurement device of one of claim 1, wherein:
in the group of logic blocks, the combinations are connected in parallel.

7. A measurement device of one of claim 1, wherein:
the sequential circuit is a flip-flop.

8. A measurement device of one of claim 1, wherein:
the logic device is an AND circuit.

9. A measurement device of one of claim 1, wherein:
the logic device is a NAND circuit.

10. A measurement device of one of claim 1, wherein:
the logic device is an OR circuit.

11. A measurement device of one of claim 1, wherein:
the logic device is a NOR circuit.

12. A measurement device of one of claim 1, wherein:
the logic device is an XOR circuit.

13. A method of measurement wherein:
the method is performed by a measurement device comprising: a group of logic blocks, which includes at least one combination of a logic block having at least one logic device, a sequential circuit for receiving, as an input, an output of the logic block, a bypass for bypassing the logic block, and a switch for switching between a path inputting to the logic block and the bypass; and a control part; and
the method comprises:
a step in which, the control part obtains a first count of errors in the group of logic blocks and sequential circuits under irradiation of high-energy particles when the switch is turned to the path through the group of logic blocks;
a step in which, the control part obtains a second count of errors in the sequential circuits only under irradiation of high-energy particles when the switch is turned to the bypass in parallel with the path through the group of logic blocks; and
a step in which, the control part calculates an error rate of the logic blocks and sequential circuits separately based on a count of errors obtained by subtracting the first count of errors from the second count of errors.

* * * * *